United States Patent [19]
Rao

[11] Patent Number: 6,005,799
[45] Date of Patent: Dec. 21, 1999

[54] METHODS AND CIRCUITS FOR SINGLE-MEMORY DYNAMIC CELL MULTIVALUE DATA STORAGE

[75] Inventor: G. R. Mohan Rao, Dallas, Tex.

[73] Assignee: Silicon Aquarius

[21] Appl. No.: 09/130,136

[22] Filed: Aug. 6, 1998

[51] Int. Cl.$^6$ .................................................. G11C 11/56
[52] U.S. Cl. .......................... 365/168; 365/149; 365/205
[58] Field of Search ..................................... 365/168, 149, 365/205, 207

[56] References Cited

U.S. PATENT DOCUMENTS

| | | | |
|---|---|---|---|
| 5,729,490 | 3/1998 | Calligaro et al. | 365/185.03 |
| 5,751,634 | 5/1998 | Itoh | 365/185.17 |

OTHER PUBLICATIONS

Okuda et al., A Four–Level Storage 4–Gb DRAM, IEEE Journal of Solid State Circuits, vol. 2, No. 11, pp. 1743–1747, Nov. 1997.

*Primary Examiner*—Huan Hoang
*Attorney, Agent, or Firm*—James J. Murphy, Esq.; Winstead Sechrest & Minick

[57] ABSTRACT

A multivalue dynamic random access memory cell and method therefor are provided. Sense circuitry for sensing a most significant bit (MSB) and a least significant bit (LSB) of a binary data value are coupled to an unsegmented complementary bitline pair. The binary data is represented by a multilevel voltage stored on a storage element in the DRAM cell. A reference signal is provided to the sense circuitry, wherein the reference signal is independent of a precharge on the bitline pair. Cross-coupling elements offset the reference signal in response to the sensing of the MSB, whereby the voltage levels corresponding to the LSB are sensed. Following a read, the multilevel data value is restored on the storage element by a restore/write unit including a programmable voltage supply. The detected MSB/LSB pair are input to the restore/write unit which outputs the corresponding voltage level to the DRAM cell. A write is effected using the same restore/write unit with the binary datum to be stored input to the restore/write unit.

16 Claims, 2 Drawing Sheets

METHODS AND CIRCUITS FOR SINGLE-MEMORY DYNAMIC CELL MULTIVALUE DATA STORAGE

TECHNICAL FIELD

The present invention relates in general to electronic semiconductor memories and in particular to methods and circuits for single-memory cell multivalued data storage.

BACKGROUND INFORMATION

Current computer processing systems operate on binary data wherein a logic 1 is represented by a high voltage level (approximately Vcc, typically 3.3 or 5V) and a logic 0 is represented by a low voltage level (approximately Vss, typically 0V or ground). Consequently, conventional random access memory cells, dynamic (DRAM) or static (SRAM) charge a cell capacitor to the high voltage level to store a logic 1 and discharge the capacitor to the low voltage level to store a logic 0. During a read in DRAM's, the voltage on the cell capacitor (which may have drifted due to leakage) is differentially sensed against a reference voltage set between Vcc and Vss and then, depending on the result, restored by latching to the full Vcc or Vss level. Data from the cell is similarly output to the periphery and ultimately outside the DRAM device itself by driving various input/output (I/O) lines to approximately Vcc or Vss.

One of the main thrusts of current DRAM development efforts is to provide for the storage of more bits per DRAM chip (storage capacity). One means for accomplishing this goal is to increase DRAM cell density (i.e., the number of cells per given chip area). This requires the development of advanced circuit design and fabrication techniques to pack smaller cells into denser arrays, which is a time consuming and expensive process. Further, as DRAM cells become smaller and the arrays more dense, device physics increasingly become a limiting factor in the pace of progress in the development of new DRAMs. In any event, the development of new high cell-density DRAMs may take years to advance the design from theory to a commercially viable product.

Proposals have been made to increase memory capacity (for both volatile memory, such as DRAM, and non-volatile memory such as flash memory) by storing multiple bits per cell. In one approach, more than the traditional two voltage levels can be impressed on the storage mechanism of a cell, with each voltage level representing a different data value. For example, assume that for a given cell, data can be stored as one of four allowed voltage levels. A voltage of 0V can then be used to represent a two bit logic word "00", a voltage of approximately 1V to represent a logic "01", a voltage of approximately 2V to represent a logic "10" and a voltage of approximately 3V to represent a logic"11". In this fashion, an MSB and an LSB can be stored in a single cell. The exact voltages and the number of voltage levels used vary from scheme to scheme.

The actual implementation of these multivalued memories presents a number of problems. For instance, Murotani et al. (1997 IEEE International Solid State Circuit Conference, Digest of Technical Papers, pp 74–75, 1997) have proposed a 4-level storage device in which both a most significant bit (MSB) and an least significant bit (LSB) can be stored in a single cell as a function of capacitor voltage. The MSB is detected by sensing the stored voltage against a reference voltage that is substantially one-half of Vcc. After sensing, the LSB is then sensed against one-half of Vcc of offset by approximately one-third Vcc. The sign of the offset, (+, -), depends on the MSB (1,0).

Obtaining an adequate sense signal disadvantageously requires that the storage capacitor has a large capacitance, which in turn implies a chip area occupied by the storage element or a use of a high dielectric constant material in constructing the capacitor, or possibly a combination of both.

Moreover, the sense scheme in the prior art requires a specific bitline structure to effect proper sense and restore operation. The bitline pairs are segmented into two sections. The sections are unequal with one section disadvantageously required to have a bitline capacitance twice that of the other bitline section.

A need has therefore arisen for new circuitry and methods for implementing multivalued storage. The problem of efficient use of chip area must be addressed. A reduction in the density of storage elements on a chip vitiates the advantage offered by multilevel storage. To this end, the task of minimizing the size and complexity of the necessary circuitry cannot be ignored.

SUMMARY OF THE INVENTION

The aforementioned needs are addressed by the present invention. Accordingly there is provided in a first form multivalue dynamic random access memory (DRAM) cell. The cell includes first circuitry operable for sensing a least significant bit (LSB) of a stored data value, in which the first circuitry has first and second nodes operable for coupling to a respective one of a complementary bitline pair, and a first storage element operable for storing a reference voltage coupled to the third node, the reference voltage operable for providing a reference signal thereto, wherein the reference voltage is independent of a precharge on the bitline pair. Also included is a second storage element operable for storing the reference voltage coupled to the second node, the reference voltage operable for providing a reference signal thereto. A first cross-coupling element is coupled to the first storage element, the first cross-coupling element operable for providing a signal for offsetting the reference signal in response to the MSB, and a second cross-coupling element coupled to the second storage element, the second cross-coupling element operable for providing a signal for offsetting the reference signal in response to the MSB.

There is also provided, in a second form, a memory containing an array of row and columns of memory cells and a plurality of bitlines, each associated with a one of the plurality of columns. Each of the memory cells includes first circuitry operable for sensing a most significant bit (MSB) of a stored data value, the first circuitry coupled to a corresponding one of the plurality of bitlines, and second circuitry operable for sensing a least significant bit (LSB) of a stored data value, the first circuitry coupled to the corresponding one of the plurality of bitlines, wherein the MSB and the LSB are output on the corresponding bitline. Each cell also includes a data storage element operable for coupling to the corresponding bitline. The memory further contains a (read) write/restore unit coupled to the plurality of bitlines, the write/restore unit operable for receiving a multi-bit binary data value and, in response thereto, outputting a multilevel stored data value for storage in the data storage element.

Additionally, there is provided, in a third form, a method of storing a plurality of data bits in a memory cell. The method constitutes the steps of, for a write to the memory cell, providing the plurality of data bits to a programmable voltage supply, the programmable voltage supply outputting a preselected voltage representing the plurality of data and storing the preselected voltage in a storage element in the cell. The method also includes the steps of, for a read operation, sensing a most significant bit (MSB) of the data bits in response to the preselected voltage in the storage element, and sensing a least significant bit (LSB) of the data bits in response to the preselected voltage in the storage element and the MSB. Following a read operation, the method steps include restoring the preselected voltage in the storage element, wherein the step of restoring contains the steps of providing the MSB and the LSB to the programmable voltage source, and outputting the preselected voltage in response to the MSB and the LSB.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

The principles of the present invention and their advantages are best understood by referring to the illustrated embodiment depicted in FIGS. 1–4 of the drawings, in which like numbers designate like parts.

Figure 1:
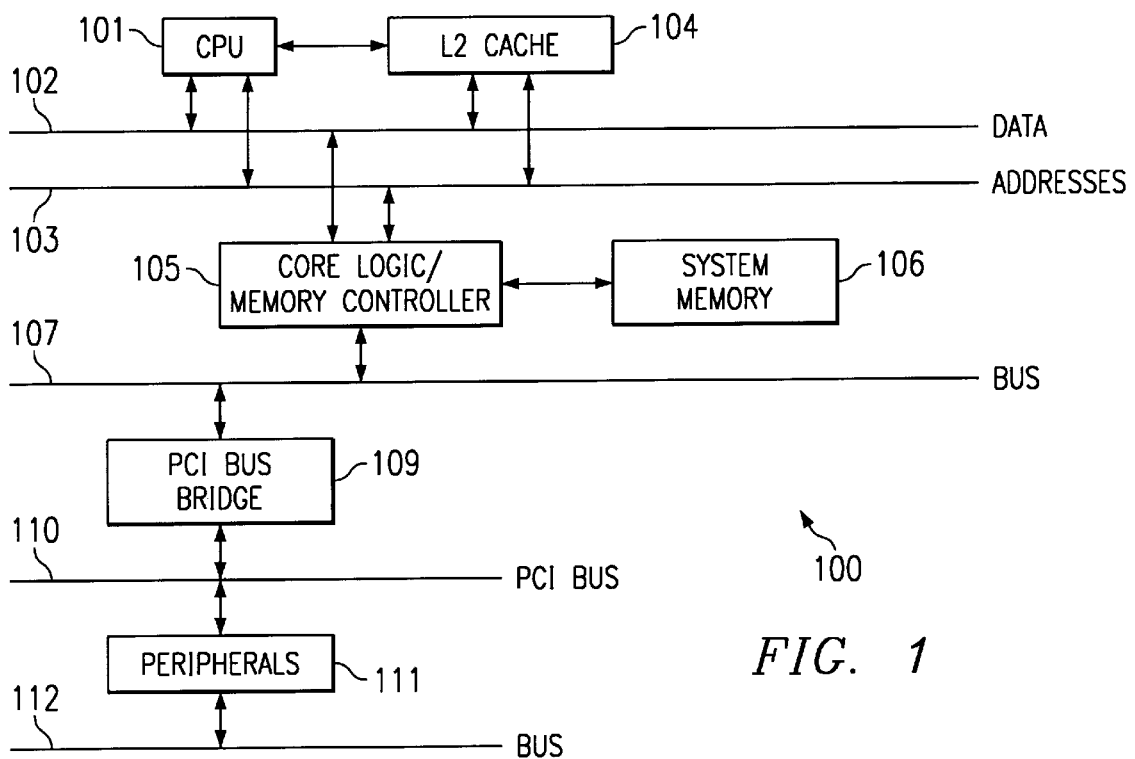
FIG. 1 is a high level block diagram of an exemplary personal computer system suitable for applying the principles of the present invention.

FIG. 1 is a block diagram depicting a basic system architectures 100 typical of those found in desktop and notebook personal computers (PCS). While numerous variations on these basic architectures exist, FIG. 1 is suitable for describing the basic structure and operation of most PCS. In a hand held "PC", the system memory could be a SRAM, whereas a desktop/notebook PC uses DRAM for system memory.

System 100 includes a single central processing unit 101, CPU local data bus 102, CPU local address bus 103, external (L2) cache 104, core logic/memory controller 105, and system memory 106. Bus 107 in this case is preferably a peripheral controller interface (PCI) bus, although alternatively it could be an ISA, general, or special purpose bus, as known in the art. In system 100, core logic/memory controller 105 is coupled to bus 107. A PCI bus bridge then interfaces bus 107 with a PCI bus 110, to which the peripherals 111 couple. An additional bus 112, which may be a ISA, PCI, VESA, IDE, general, or special purpose bus, is provided for access to peripherals 111 from an external device or system (not shown).

In single CPU system 100, CPU 101 is the "master" which, in combination with the operating system and applications software, controls the overall operation of system 100. Among other things, CPU 101 performs various data processing functions including numerical and word processing, generates graphics data, and performs overall system management. CPU 101 may be for example a complex instruction set computer (CISC), such as an Intel Pentium class microprocessor, a reduced instruction set computer (RISC), such as a Apple PowerPC microprocessor, or a very long instruction word (VLIW) machine.

CPU 101 communicates with the remainder of system 100 via CPU local address and data buses 102 and 103, each of which may be for example a special bus, or a general bus, as known in the art.

Core logic/memory controller 105, under the direction of CPU 101, controls the exchange of data, addresses, control signals and instructions between CPU 101, system memory 105, and peripherals 108/111 via bus 107 and/or PCI bus bridge 109. Although the core logic/memory controller allows tasks to be shifted from the CPU, thereby allowing the CPU to attend to other CPU-intensive tasks, the CPU can always override core logic/memory controller 105 to initiate execution of a higher priority task.

Core logic and memory controllers are widely available in the PC industry and their selection and application well known by those skilled in the art. The memory controller can be either a separate device or incorporated into the same chip set as the core logic. The memory controller is generally responsible for generating the memory clocks and control signals such as R/W and bank select (in multibank memory systems). The memory controller may also have some address generation capability for accessing sequences of pages.

The core logic is typically comprised of a chip-set, with one or more chips typically being "address and system controller intensive" and one or more chips typically being "data intensive." Among other things, the address intensive chip(s): interfaces CPU 101 with address bus 103; maintains cache memory (SRAM), including the cache tags, set associative cache tags and other data necessary to insure cache coherency; performs cache "bus snooping"; generates the control signals required for DRAMs in the system memory or cache; and controls general management transactions. The data intensive chip(s) generally: interfaces CPU 101 with the data bus 102; issues cycle completion responses; may abort operations if their cycles are incomplete; and arbitrates for the data path of bus 102.

CPU 101 can directly communicate with core logic/memory controller 105 or through an external (L2) cache 104. L2 cache 104 may be for example a 256 KByte fast SRAM device(s). Typically, the CPU also maintains up to 16 kilobytes of on-chip (L1) cache.

PCI bus bridges, such as PCI bus bridge 109, are also well known to those skilled in the art. In the typical PC, the CPU is the bus master for the entire system and hence devices such as PCI bus bridge are slave devices which operate under command of the CPU.

Peripherals 111 may include a display controller and associated frame buffer, floppy drive controller, disk driver controller, and/or modem, to name only a few options.

Figure 2:
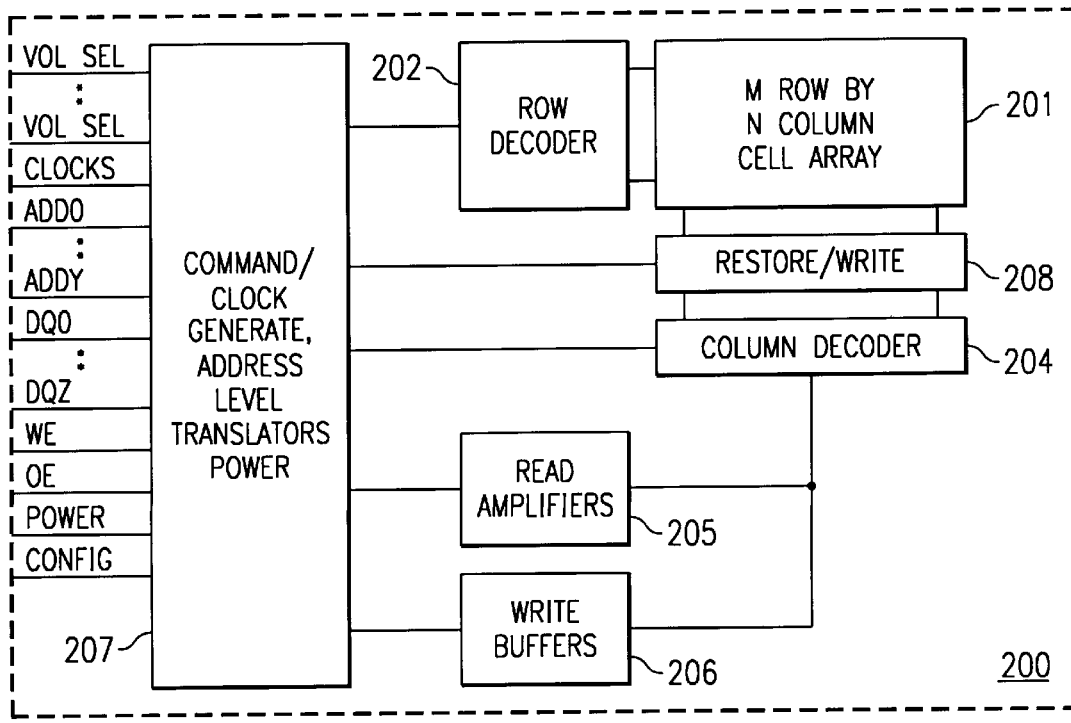
FIG. 2 is a block diagram of a memory subsystem or device which may be used in such applications as the system memory, or L2 (level 2) cache memory.

FIG. 2 is a high level functional block diagram of a memory 200 suitable for such applications as the construction of system memory 106. Memory 200 includes an array 201 of rows and columns of the memory cells discussed below. A row of cells in array 201 is selected in response to a received row address by row decoder 202 which activates the conductive wordline coupled to the cells of the selected row. Each column of cells is associated by a conductive bitline consisting of a pair of complementary half-bitlines. During a read, the data from an entire row of cells are sensed Subsequently, column decoder 204, in response to a received column address, selectively passes a set of the desired data to the device I/O circuitry 207. A write operation is similar. The basic memory storage element (also called a cell) for DRAM's may be a one-transistor/one-capacitor (1-T/1-C) cell, a two-transistor/one-capacitor (2-T/1-C) cell, or a three-transistor cell. These alternative embodiments are known to persons skilled in the art.

The data passed by column decoder 204 during a read operation may be directly driven through memory input/output (I/O) port DQ0-DQZ by the accessed cells themselves or optionally through a set of read amplifiers 205. During a write, write buffers 206 drive received data from the I/O port through the column decoder (which selects the bitlines of the cells to be written) and the sense amplifiers to array 201.

I/O block 207 generally includes the traditional I/O and control circuitry such as, address latches, read/write select and clock generation circuitry. In the illustrated embodiment, a non-multiplexed address bus is coupled to port ADD0-ADDY through which row and column addresses are concurrently input. The write enable (/WE) and output enable (/OE) control the input and output of data through the data port DQ0-DQZ. A multiplexed address scheme may also be used.

In addition to the conventional memory control ports, an additional port is now included. A voltage restore (Vol. Res.) port receives programming data for selecting an output voltage of restore unit 208. Restore unit 208 includes a programmable voltage source for restoring the corresponding multilevel data value following a read from a multilevel DRAM cell in array 201. In a four-level embodiment, the voltage restore port may be two-bits wide.

Figure 3:
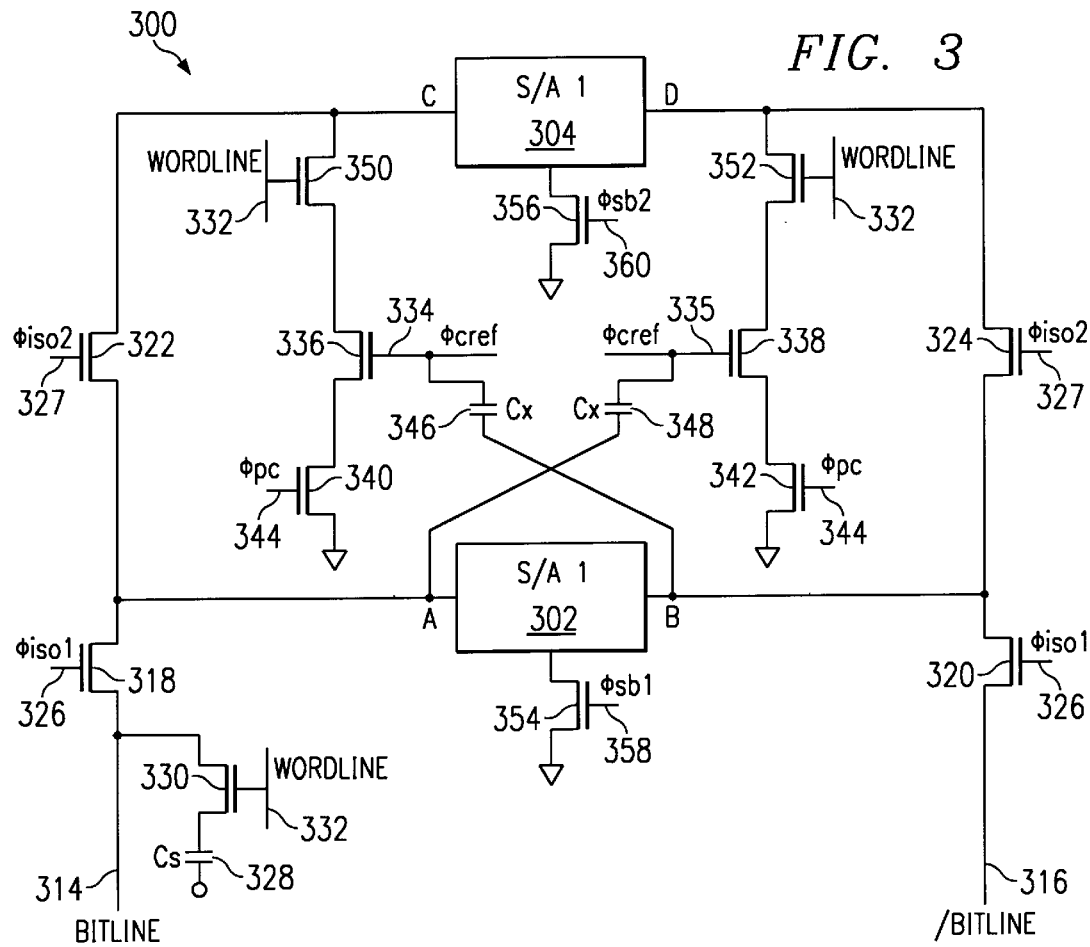
FIG. 3 is a circuitry level diagram of a memory cell sensing, read, write and restore architecture according to the present inventive concepts and suitable for use in such applications as the data memory depicted in FIG. 3.

Refer now to FIG. 3 in which is illustrated multilevel dynamic random access memory (DRAM) cell 300 in accordance with the principles of the present invention. DRAM cell 300 includes a pair of sense amplifiers (S/A) 302 and 304 having a pair of nodes "A" and "B", and "C" and "D", respectively.

The nodes may be isolated from bitline 314 and /bitline 316 by a plurality of metal oxide semiconductor (FET) devices. Nodes A and B are coupled to bitline 314 and /bitline 316 by FET devices 318 and 320 respectively. Likewise, node C is coupled to bitline 314 by FETs 318 and 322, and node D is coupled to /bitline 316 by FETs 320 and 324. Gates of FETs 318 and 320 receive a clocked isolation signal 326, $\phi_{iso1}$, and isolate bitline 314 and /bitline 316 in response thereto. Similarly, gates of FETs 322 and 324 receive a clocked isolation signal 327, $\phi_{iso2}$, whereby bitline 314 and /bitline 316 are isolated. In isolating the bitlines, isolation signals 336 and 337 will be said to be "asserted". It will be understood that in an embodiment in which FETs 318, 320, 322 and 324 are n-type devices, signals 336 and 337 would be "low", or near Vss. Similarly, negating isolation signals 336 and 337 result in FETs 318, 320, 322, and 324 turning on, that is not isolating the bitlines, and would correspond, in an n-type embodiment of FETs 318, 320, 322, and 324, to signals 336 and 337 being "high," or near Vcc.

Conversely, in a p-type embodiment of FETs 318, 320, 322 and 324, asserting signals 336 and 337 corresponds to a logic "high", or near Vcc and negating signals 336 and 337 corresponds to a logic "low," or near Vss. Operation of FETs 318, 320, 322, and 324 will be further described below.

Multilevel data is sensed by comparing a data value stored in storage capacitor 328 against a preselected reference voltage. Storage capacitor 328 is coupled to bitline 314 through FET 330. A gate of FET 330 is coupled to word line 332. Clocked reference signal 334 is stored is a pair of FETs, FET 336 and FET 338 which serve as capacitors. During a read of dynamic RAM device 300, FETs 336 and 338 are isolated by FETS 340 and 342 respectively. FETS 340 and 342 have gates that are coupled to clocked precharge signal 344. During a read of DRAM cell 300, precharge 344 turns off FETs 340 and 342, whereby FETs 336 and 338 are isolated, serving as storage elements storing reference voltage 334. The gate-channel capacitance (inclusive of the insulator capacitance) of FETs 336 and 338 stores reference voltage 334. During precharge of bitline 314 and /bitline 316, precharge 344 turns on FETs 340 and 342, discharging the capacitances represented by FETs 336 and 338. It is advantageous to employ FETs in this way as storage capacitances to control process variations. However, in an alternative embodiment, conventional very large scale integration (VLSI) capacitors may be used to set the reference charge. Reference voltage 334 is further coupled to node A and node B by cross-coupling capacitors 346 and 348.

The reference voltages stored in FETs 336 and 338 are coupled to bitline nodes C and D by FET 350 and FET 352, respectively. FETs 350 and 352 are effectively access transistors for the appropriate half of the memory array.

During a read operation, S/As 302 and 304 are turned on sequentially to evaluate a most significant bit (MSB) and a least significant bit (LSB) of a multivalued data value stored in capacitor 328. Sequential turn-on of S/As 302 and 304 is provided by FET 354 coupled to S/A 302 and FET 356 coupled to S/A 304. Sense signal 358 is provided at a gate of FET 354 to turn on S/A 302 and a sense signal 360 is provided at a gate of FET 356 to turn on S/A 304. Sense 360 may be delayed with respect to sense 358 to sequentially turn on S/As 304 and 302.

On initiation of a read cycle, the sense amplifiers are held and the stored multilevel data value is transferred to the bitline. Both S/A 302 and S/A 304 are held in their precharge state by negating sense signals 358 and 360, turning off FETs 354 and 356. Wordline 332 is asserted, coupling storage capacitor 328 to bitline 314. Isolation FETs 318 and 322 are also turned on, by signal 326 and FETs 324 and 326 are turned on by signal 327. This couples nodes A and C to bitline 314, and nodes B and D to /bitline 316. Thus nodes A and C of S/A 302 and 304, respectively are pulled up, or down, depending on the stored voltage in capacitor 328. The amount by which the nodes are pulled up or down constitutes a signal voltage.

Multilevel data is read from DRAM cell 300 by first detecting the most significant bit (MSB). The MSB is detected at S/A 302 by sensing the signal at node A against a reference voltage. The reference is provided to S/A 302 via clocked reference signal 334 which is coupled to S/A 302 by capacitors 346 and 349. Reference signal 334 is independent of a precharge voltage on bitline 314 and /bitline 316. Reference signal 334 is supplied to DRAM cell 300 via I/O block 207 of memory 200.

The value of the reference signal for detecting the MSB depends on the maximum signal voltage, $V_m$, in DRAM cell 300. In turn, is determined by a maximum voltage stored in capacitor 328 and a ratio of a capacitance of capacitor 328 to a capacitance associated with bitline 314. In an embodiment of the present invention data values having a MSB of "1" may be represented by corresponding voltages exceeding one-half of the maximum stored voltage. (It would be understood that the maximum stored voltage may, but need not, be Vcc.) In such an embodiment of the present invention, the maximum stored voltage may be associated with a four-level data value of "11". For detection of the MSB, the signal voltage is compared with $V_m/2$, in such an embodiment. The reference voltage is supplied by reference signal 334, and, as noted above, is independent of the precharge voltage on the bitlines.

Preferably, DRAM 300 includes FETs 318, 320. In such an embodiment, during sensing, S/A 302 is isolated from bitline 314 and /bitline 316 by FETs 318 and 320 which are turned off by asserting isolation signal 326. Isolating the sense amplifiers in this way is to be preferred in that it improves speed and accuracy by reducing capacitive loading on the sense amplifiers. Isolation signal 326 is provided to DRAM cell 300 via I/O block 207 of memory 200. In a preferred embodiment having isolation FETs 318 and 320, the value of reference signal 344 is the established by $V_m/2$ and the capacitive voltage divider represented by capacitor 346 and a capacitance associated with bitline segment 308.

Sensing of the MSB may be understood by considering an illustrative four-level storage scheme. The two data bits may be represented the four levels in accordance with the following correspondence between the data bits and the stored voltage, $V_{stor}$:

TABLE 1

| Binary Data | | $V_{stor}$ |
| --- | --- | --- |
| 0 | 0 | 0.0 V |
| 0 | 1 | 1.1 V |
| 1 | 0 | 2.2 V |
| 1 | 1 | 3.3 V |

It would be understood that the corresponding signal voltages would be proportional to the ratio of $V_m$ and the maximum value of $V_{stor}$ (3.3 Volts in an embodiment according to Table 1), and that, for simplicity, sensing will be described in terms of the voltages in Table 1. The scaled reference voltage then becomes 1.65V, one-half of the maximum stored voltage.

To sense the MSB, S/A 302 is rendered active. Sense 358 is asserted, turning on FET 354. If the MSB is "1", the stored voltage, according to Table 1, may be either 2.2V or 3.3V, depending on the least significant bit (LSB). Node A is pulled above the reference at node B, and S/A 302 drives node A to Vcc, and correspondingly, node B is pulled to Vss. If the value of the MSB is "0", the stored voltage may either be 0V or 1.1V, depending on the LSB. Then node A is pulled below the reference, and S/A 302 drives node A to Vss and node B to Vcc. In a preferred embodiment having isolation FETs 318 and 320, the MSB is then coupled onto bitline 314 and /bitline 316 by turning on FETs 318 and 320, by negating isolation signal 326. In an embodiment without FETs 318 and 320, bitline 314 and /bitline are driven with nodes A and B, respectively. Following sensing of the MSB, S/A 302 is deactivated by turning off FET 354 in preparation for sensing of the LSB. FETs 322 and 324 remain off by holding isolation signal 327 "low".

S/A 304 senses the LSB. The reference levels presented to S/A 304 are shifted depending on the value of the MSB detected. The values driven onto bitline 314 and /bitline 316 by S/A 302 are coupled to FETs 336 and 338 by capacitors 346 and 348, respectively. This offsets the reference level at node C by an amount depending on the capacitive voltage divider formed by the gate-channel capacitance of FET 336 and capacitor 346. Similarly the reference level at node D is offset from the reference provided by signal 334 by an amount depending on the capacitive divider formed by the gate-substrate capacitance of FET 338 and capacitor 348. The capacitance ratios of these capacitors are preselected such that, in an embodiment of the present invention, the magnitude of the offset is approximately one-fourth of the maximum stored voltage. As discussed above, the maximum stored voltage may, but need not be Vcc. In such an embodiment, the capacitance ratios are scaled accordingly, to account for the bitlines being driven to Vcc and Vss.

Sensing of the LSB is effected by activating S/A 304. Sense 360 is asserted, turning on FET 356. After the level shift described above, the voltage at node C, $V_C$, and the reference at node D, $V_D$ may be, in an embodiment of the present invention as indicated in Table 2:

TABLE 2

| Binary Data | | $V_C$ | $V_D$ |
| --- | --- | --- | --- |
| 0 | 0 | .8 V | .85 V |
| 0 | 1 | 1.9 V | .85 V |
| 1 | 0 | 1.4 V | 2.45 V |
| 1 | 1 | 2.5 V | 2.45 V |

Thus, if a MSB of "1" has been detected, and the LSB has the value "0", node C has been pulled below node D, and S/A 304 drives bitline 314 and /bitline 316 to Vss and Vcc, respectively. Likewise, if an MSB of "0" has been detected and the LSB is "0", node C is also pulled below node D, and S/A 304 also drives bitline 314 to Vss and /bitline 316 to Vcc. Conversely, if the LSB has the value "1" and an MSB of "1" has been detected by S/A 302, node C, although pulled down, remains above node D although node D has been pulled up, and S/A 304 drives bitline 314 to Vcc and /bitline 316 to Vss, thereby detecting the LSB of "1". Similarly, if an MSB of "0" has been detected, node C is pulled above node D which has been pulled down, and S/A 304 drives bitline 314 and /bitline 316 to Vcc and Vss, respectively. It would be understood that other offsets may be accommodated within the principles of the present invention, provided that the relationship between signal node C and reference node D are maintained as described herein.

In a preferred embodiment having isolation FETs 318 and 320, LSB is coupled onto bitline 314 and /bitline 316 by turning on FETs 318 and 320 by negating isolation signal 326, as well as turning on FETs 322 and 324 by negating isolation signal 327.

Following a read, the voltage on storage capacitor 328 representing the multilevel data must be restored. S/A 302 and 304 are deactivated by turning off FETs 354 and 356, respectively. Restore is effected by restore/write unit 208, in FIG. 2. Restore/write unit 208 includes a programmable voltage source. An output voltage is selected by a signal at the voltage restore port in I/O circuitry 207. The signal on the voltage restore port is issued by a core logic/memory controller, such as core logic/memory controller 105 in FIG. 1, in response to the data bits detected during the read. The output voltage is set on bitline 314 and stored in capacitor 328 by turning on FET 330 via wordline 332. Following restore, FET 330 is turned off, and bitline 314 and /bitline 316 precharged to a preselected precharge voltage, as in conventional two-level DRAM. However, in cell 300, during precharge, FETs 340 and 342 are turned on, discharging the gate-channel capacitances of FETs 336 and 338, thereby readying them for the next read cycle.

A write to cell 300 is effected through restore/write unit 208, FIG. 2. A write operation is similar to a restore. The data bits are presented to restore/write 208 via voltage select port in I/O block 207. These program restore/write 208 which outputs the corresponding multilevel voltage for storage in capacitor 328.

Figure 4:
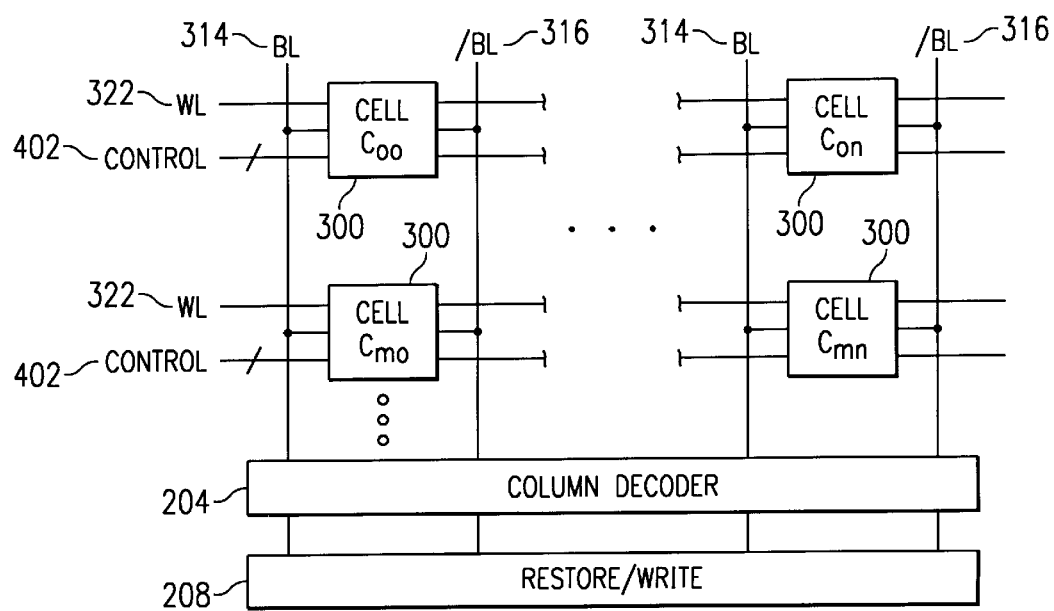
FIG. 4 is a block diagram of a portion of a memory core which includes an array of cells similar to those shown in FIG. 3.

FIG. 4 is a block diagram of a portion of a memory core 400, which includes an array of memory cells 300 arranged in m number of rows and n number of columns. The cells have been labeled $C_{ij}$, where i is the row number from 0 to m-1 and j is the column number from 0 to n-1. It should be noted that in actual implementation, the number of cells in core memory 400 may range from a very few to several billion, depending on the application.

Data values are both driven and received through device I/O 207. Column decoders 403 can be used to selectively exchange data between the columns (bitlines) and device I/O circuitry 207. As described in detail hereinabove, during a read, the MSB and LSB of a multilevel binary data value are sequentially driven out the complementary pair of bitlines 316 and bitline 318. The multilevel binary data received during a write are "level translated" into a multilevel stored voltage by restore/write 208 and driven onto bitline 314. Each cell 300 also receives a plurality of control signals 402 which includes reference signal 334, isolation signals 326 and 327 and sense signals 356 and 358, and precharge 344.

One of the many uses of memories utilizing the present inventive concepts is in low cost computing systems, such as "network" computers. In network computers, the end user maintains a terminal with a minimum of processing power. The local memory is also very small. The main repository of software and the site of major processing power is with an associated server. Multivalued memory can be used to construct the small, user-terminal local memory inexpensively. Multivalued memory is, of course, useful in the system memory and cache memory construction in full processing systems and devices.

Although the present invention and its advantages have been described in detail, it should be understood that various changes, substitutions and alterations can be made herein without departing from the spirit and scope of the invention as defined by the appended claims.

What is claimed is:

1. A multivalue dynamic random access memory (DRAM) cell comprising:
    first circuitry operable for sensing a least significant bit (LSB) of a stored data value, said first circuitry having first and second nodes operable for coupling to a respective one of a complementary bitline pair;
    a first storage element operable for storing a reference voltage coupled to said first node wherein said reference voltage is independent of a precharge voltage on said bitline pair;
    a second storage element operable for storing said reference voltage coupled to said second node;
    second circuitry operable for sensing a most significant bit (MSB) and having third and fourth nodes for coupling to a respective one of said complementary bitline pair;
    a first cross-coupling element coupled to said first storage element and said fourth node to form a dynamic voltage divider with said first storage element, said first cross-coupling element operable for providing a signal for offsetting said reference signal in response to said MSB; and
    a second cross-coupling element coupled to said second storage element and said third node to form a dynamic voltage divider with said second storage element, said second cross-coupling element operable for providing a signal for offsetting said reference signal in response to said MSB.

2. The memory cell of claim 1 wherein said first and second storage elements each comprise a gate-substrate capacitance of a conductor oxide semiconductor device.

3. The memory cell of claim 1 wherein said first and second storage elements comprise a conventional capacitor.

4. The memory cell of claim 1 further comprising a third storage element operable for coupling to a first one of a complementary bitline pair, said third storage element being operable for storing said stored data value.

5. The memory cell of claim 1 wherein said first and second cross-coupling elements comprise first and second cross-coupling capacitors.

6. The memory cell of claim 1 further comprising a first switch for coupling said first node to a first one of said pair of complementary bitlines and a second switch for coupling said second node to a second one of said pair of complementary bitlines.

7. The memory cell of claim 6 wherein said first and second switches comprise metal oxide semiconductor devices (FETs).

8. The memory cell of claim 1 further comprising a first switch for coupling said third node to a first one of said pair of complementary bitlines and a second switch for coupling said fourth node to a second one of said pair of complementary bitlines.

9. The memory cell of claim 8 wherein said first and second switches comprise metal oxide semiconductor devices (FETs).

10. A random access memory comprising:
    an array of rows and columns of memory cells;
    plurality of bitlines, each associated with a one of said plurality of columns,
    wherein each of said memory cells comprises:
        first circuitry operable for sensing a most significant bit (MSB) of a stored data value, said first circuitry coupled to a corresponding one of said plurality of bitlines;
        second circuitry operable for sensing a least significant bit (LSB) of a stored data value, said first circuitry coupled to said corresponding one of said plurality of bitlines, wherein said MSB and said LSB are output on said corresponding bitline;
        a data storage element operable for coupling to said corresponding bitline; and
    a write/restore unit coupled to said plurality of bitlines, said write/restore unit including a programmable voltage supply operable for receiving a multibit binary data value and, in response thereto, outputting a multilevel stored data value for storage in said data storage element.

11. The memory of claim 10 wherein said second circuitry includes first and second storage elements operable for storing a reference voltage respectively coupled to first and second nodes of a first sense amplifier, said reference voltage being operable for providing a reference signal level to said sense amplifier, and wherein said reference signal level is independent of a precharge on said plurality of bitlines.

12. The memory of claim 11 wherein said first circuitry includes a second sense amplifier having third and fourth nodes, and first and second cross-coupling elements respectively coupled between said first storage element and said fourth node and between said second storage element and said third node, wherein said cross-coupling elements are operable for shifting said reference signal level in response to said MSB.

13. The memory of claim 11 wherein said first and second each comprise a gate-substrate capacitance of a metal oxide semiconductor device.

14. A method of storing a plurality of data bits in a random access memory cell comprising:

for a write to said memory cell:

providing said plurality of data bits to a programmable voltage supply, said programmable voltage supply outputting a preselected voltage representing said plurality of data bits;

storing said preselected voltage in a storage element in said cell;

for a read operation:

sensing a most significant bit (MSB) of said data bits in response to said preselected voltage in said storage element;

sensing a least significant bit (LSB) of said data bits in response to said preselected voltage in said storage element and said MSB;

following a read operation, restoring said preselected voltage in said storage element, said step of restoring comprising:

providing said MSB and said LSB to said programmable voltage source; and outputting said preselected voltage in response to said MSB and said LSB.

15. The method of claim 14 wherein said step of sensing said MSB comprises the steps of providing sense circuitry for sensing said MSB;

providing a preselected reference signal to said first sense circuitry, wherein said preselected reference voltage is independent of a precharge on said first sense circuitry; and differentially comparing said preselected voltage and said reference signal.

16. The method of claim 14 wherein said step of sensing said LSB comprises the steps of:

providing sense circuitry for sensing said LSB, said circuitry having a pair of differential inputs;

providing a preselected reference signal to said pair of differential inputs, wherein said preselected reference voltage is independent of a precharge on said first sense circuitry;

differentially shifting said reference signal by a predetermined shift in response to said MSB;

providing said preselected voltage to one of said pair of differential inputs; and activating said sense circuitry, wherein said sense circuitry assumes a one of two equilibrium states in response to signals provided on said differential inputs.

* * * * *